United States Patent
Yokozuka

(10) Patent No.: US 7,535,092 B2
(45) Date of Patent: May 19, 2009

(54) SI POWER DEVICE MOUNTED ON A SUBSTRATE INCLUDING ARRANGEMENTS TO PREVENT DAMAGE TO CONNECTION LAYERS DUE TO HEAT TREATMENT

(75) Inventor: Takehide Yokozuka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 256 days.

(21) Appl. No.: 11/362,709

(22) Filed: Feb. 28, 2006

(65) Prior Publication Data

US 2006/0192291 A1    Aug. 31, 2006

(30) Foreign Application Priority Data

Feb. 28, 2005    (JP) ............... 2005-052249

(51) Int. Cl.
*H01L 23/48* (2006.01)

(52) U.S. Cl. ............... 257/688; 257/723; 257/E23.085

(58) Field of Classification Search ............ 257/688, 257/723, 181

See application file for complete search history.

(56) References Cited

U.S. PATENT DOCUMENTS

| 5,308,782 | A | 5/1994 | Mazure et al. | |
| 6,583,514 | B2 * | 6/2003 | Tago et al. | 257/778 |
| 2004/0145869 | A1 | 7/2004 | Tanaka et al. | |
| 2007/0040186 | A1 * | 2/2007 | Fillion et al. | 257/177 |

FOREIGN PATENT DOCUMENTS

| JP | 06-069441 | | 3/1994 |
| JP | 2004-006603 | * | 1/2004 |
| JP | 2004511069 | | 4/2004 |
| JP | 2004-178557 | | 6/2004 |
| JP | 2005-076584 | | 3/2005 |
| WO | WO 200229844 A1 | | 4/2002 |

OTHER PUBLICATIONS

Ricky W. Chuang et al.: 51th Electronic Components and Technology Conference (2001), pp. 671-674.

* cited by examiner

*Primary Examiner*—Phat X Cao
(74) *Attorney, Agent, or Firm*—Antonelli, Terry, Stout & Kraus, LLP.

(57) ABSTRACT

An electronic device includes a pair of members which are connected to each other by a connecting portion layer interposed between connecting portions respectively formed thereon and which have thermal expansion coefficients different from each other. The connection layer is formed by diffusion reaction between the metal layers by which the metal layers are melted only in the vicinity of a contact interface between the layers, the metal layers being formed on the connecting portions with materials different from each other. At least one of the metal layers is formed by plating, thereby the connection layer is formed in a thickness sufficient to absorb differences in thermal expansion coefficients between the pair of members. Since melting temperature of the connection layer after the pair of members have been connected to each other is increased compared with melting temperature of each of the members in the diffusion reaction, the connection layer is prevented from being damaged due to heating treatment performed after the connection has been made, consequently excellent reliability of the electronic device is secured.

1 Claim, 7 Drawing Sheets

SI POWER DEVICE MOUNTED ON A SUBSTRATE INCLUDING ARRANGEMENTS TO PREVENT DAMAGE TO CONNECTION LAYERS DUE TO HEAT TREATMENT

The present application claims priority from Japanese application JP2005-052249 filed on Feb. 28, 2005, the content of which is hereby incorporated by reference into this application.

BACKGROUND OF THE INVENTION

1. Field of the Invention

The present invention relates to an electronic device represented by in-vehicle power module, and particularly relates to a structure of mounting an electronic component such as a semiconductor element on a substrate.

2. Description of the Related Art

From consideration for environmental issues, vehicles using electric motor drive, which are represented by a hybrid electric vehicle, are expected to be increasingly widespread in future. Moreover, an electric control unit (ECU) using the electric motor tends to be used for various units that have been controlled by hydraulic pressure such as power steering or a brake system. For ECU for motor control, an IDBT (Insulated Gate Bipolar Transistor) chip or FET (Field Effect Transistor) chip, which allows large current flow, is used, and heat of several ten watts to several hundreds watts is radiated from the chip (electronic component such as semiconductor element). Therefore, the chips or electronic devices having the chips are necessary to be cooled by a water cooling system or an air-cooling system. In an example of a sectional structure of an ECU module for motor control as shown in FIG. 1, a lower drain electrode of an FET chip 1 is connected onto an electrode 5 of a ceramic substrate 7 having good heat conductance, with solder 3, and the ceramic substrate 7 is adhered to a heat sink with a resin adhesive 11 having good heat conductance. Upper gate electrodes and source electrodes of the FET chip 1 are connected to predetermined electrodes 15 on the ceramic substrate 7 by a large number of wire bonding lines (bonding wires) 13. A structure of an electronic device requiring such large number of lines of wire bonding requires large investment in facility due to a process of manufacturing the device, in addition, manufacturing of the device itself requires long time and high cost. Furthermore, since surfaces of the electrodes 15 for the wire bonding needs to be kept clean, a cleaning step is separately necessary after the chip 1 has been connected with solder to the substrate 7.

Currently, calorific value of the FET chip mounted in an electronic device (for example, power module) tends to be increased, therefore an excellent heat radiation performance is requested to a structure of the device. Such request is made not only to electronic devices for vehicles (in-vehicle power modules) but also to other electronic devices used for control systems of inverters for railway vehicles, generators, lighting fixtures or thermal appliances and the like. If a step of the wire bonding can be eliminated in manufacturing the electronic devices, significant reduction in manufacturing cost can be estimated.

There was provided a structure of an electronic device as shown in FIG. 2 in the related art. That is, a ceramic material having high heat conductivity is used for the substrate 7, and the chip 1 is mounted on the ceramic substrate 7 with solder 5, and furthermore the ceramic substrate 7 is connected to a heat sink 19 for heat radiation with solder. A metal frame 21 formed from a material having excellent heat conductance such as Cu (copper) is used as a connection member in place of typical wire bonding lines, which is connected to electrodes on the chip and electrodes 23 on the substrate 7 with solder.

In addition, a report on the technique of solder connection is published in the following non-patent literature 1.
[Non-patent literature 1]
Ricky W. Chuang et all: 51th Electronic Components and Technology Conference (2001), pages 671-674

SUMMARY OF THE INVENTION

The following problems occur in a manufacturing process for realizing a structure as shown in FIG. 2. First, number of hierarchies of solder connecting portions is increased from one to three. Here, even if there are several solder connecting portions, if they can be formed without problems at the same time, they are called single-hierarchical solder connection. Solder connection needs to be carried out in an appropriate order for a structure having such multi-hierarchical solder connecting portions. For example, first a connecting portion 3 between the chip 1 and the substrate 7 is formed with solder A, next both of a connecting portion 25 between the chip 1 and the metal frame 21 and a connecting portion 23 between an electrode 15 provided on the substrate 7 and the metal frame 21 are formed with solder B at a time. Finally, the substrate 7 is connected to the heat sink 19 with solder C (connecting portion 11 in place of the resin adhesive). If the three types of solder A to C are not used, and connection is tried to be made using the same solder at a time, various problems may occur, such as displacement of connection position due to rotation of the metal frame 21 and displacement of a connection position due to rotation of the chip 1, in addition, disconnection in the solder connecting portions (or bad conduction) and electric short circuit (short). Moreover, if respective connecting portions are formed in the above order with the same solder, since an electronic device is subjected to heating history three times at most, growth of an intermetallic compound proceeds, the compound being derived from joints (the solder material layers) and electrodes provided on the device, causing a problem of reduction in reliability of the electronic device.

The three types of solder A to C can be used to address such a problem. For example, when Pb (lead)-10% Sn (tin) (melting point; about 320° C.) is used as the solder A, Sn–3% Ag (silver)–0.5% Cu (meltingpoint; about 217° C.) is used as the solder B, and Sn–37% Pb (melting point; 183° C.) is used as the solder C respectively, the electronic device can be assembled without causing such a problem by sequentially connecting between the chip 1 and the substrate 7, between the chip 1 as well as the electrode 15 on the substrate 7 and the metal frame 21, and the substrate 7 and the heat sink 19 in the above order. However, from a current market demand of requiring an electronic device without containing a solder material containing Pb, the electronic device manufactured by combining the three types of solder material having different melting points now loses commodity value, and even if an electronic device is manufactured only by using solder materials without containing Pb in place of a combination of the solder materials, it is extremely difficult to sufficiently secure reliability.

To address such a problem, for example, when a technique disclosed in the non-patent literature 1 is used, the three-hierarchical connections as above can be theoretically made only by using the solder materials without containing Pb. That is, as an electrode at an electronic component side, a Cr (chromium) layer is formed 0.03 micrometers (μm) in thickness, and a Sn layer 0.5 micrometers in thickness and an In (indium) layer 1.11 micrometers in thickness are formed thereon in a manner of being contacted to each together, and an Au (gold) layer is formed 0.05 micrometers in thickness on an uppermost surface of this stacked structure. As an electrode at a substrate side, a Cr layer is formed 0.03 micrometers (μm) in thickness, and an Au layer is formed 0.05 micrometers in thickness on an uppermost surface of the Cr layer. Sn and In are started to be melted at the neighborhood of an interface between layers of Sn and In by heating at an appropriate condition, or heating at the eutectic temperature of Sn and In (118° C.) or more, for example, 150° C. or more, and further heating is performed to proceed diffusion of In into the Sn-layer in solid phase entirely, after that formation of the connection is completed. Since an alloy portion of Sn and In in the connecting portion has a composition rich in Sn, melting temperature of the alloy portion is increased, and the alloy portion is not remelted, for example, at a temperature of 175° C. or less.

In in-vehicle electronic components that are required to have extremely high reliability compared with consumer products such as mobile devices, there have been the following problems in the solder connection.

First, in an electronic device having a Si chip (an electronic component formed on a silicon base member) that is connected to a substrate, during a process that the electronic device (connecting portion between the Si chip and the substrate included in the device) is cooled from a temperature when the Si chip was connected to the substrate to the normal temperature (room temperature), breakdown of the Si chip was caused by difference in thermal expansion coefficient between Si and the substrate. Moreover, in connection between the substrate and a heat radiating metal sheet (heat sink), only when a temperature cycling durability test is repeatedly performed 100 cycles or less to the device, in which ambient temperature of the electronic device is changed within a range of −55 to 150° C. in one cycle, breakdown was found in a connecting portion layer between the substrate and the heat radiating metal sheet due to difference in thermal expansion coefficient between them.

According to an embodiment of the invention, the following configuration is provided in order to achieve a mounting structure of assembling an electronic device by using the multi-hierarchical solder connecting portions, in addition, improve reliability of the solder connecting portions.

That is, for reducing stress and strain generated in a member such as chip and a portion associated with connection or fixing of the member, an embodiment of the invention increases thickness (height) of a connecting portion formed between two members. While described later using embodiments, in a method where metal layers having different compositions each are formed on the two members, for example, the Si chip and the substrate, and the metal layers are contacted to diffuse componential elements of both metal layers into each other, thereby the two members are connected, an embodiment of the invention forms the metal layer thick by plating and the like on at least one of the members (for example, the Si chip side or substrate). Thus, sufficient, final connection thickness of a connecting portion (connection layer) formed by the metal layers provided on the two members respectively is secured, and the stress or strain is absorbed by the connecting portion, thereby, for example, breakdown of the Si chip or breakdown of the connecting portion is avoided. Moreover, time for a plating step of the metal layer for realizing the embodiment of the invention and associated increase in cost are slight.

In the technique disclosed in the non-patent literature 1, the metal layers are formed by sputter on both of the electronic component and the substrate, therefore it is substantially difficult to form each of the metal layers in thickness of several micrometers or more. According to an embodiment of the invention, in the light of reliability of the connecting portion which is overlooked in the non-patent literature 1 (for example, durability to temperature change), there is provided a structure suitable for realizing a practically useful, electronic device.

An example of an electronic device according to an embodiment of the invention comprises an electronic component having a first electrode and at least one layer of first metal film formed on a surface of the first electrode, and a substrate having a second electrode electrically connected to the first electrode of the electronic component and at least one layer of second metal film formed on a surface of the second electrode. An uppermost surface of the first metal film is contacted to an uppermost surface of the second metal film, and then the neighborhood of an interface at which the uppermost surfaces of the first metal film and the second metal film are contacted to each other is melted at melting temperature or less of each of the first metal film and the second metal film and at eutectic temperature or more of the first metal film and the second metal film, so that an alloy portion containing respective componential elements of the first metal film and the second metal film is formed in the vicinity (neighborhood) of the interface by diffusion reaction between the first metal film and the second metal film, thereby the electronic component is connected to the substrate. Melting starting temperature of the alloy portion after the electronic component has been connected to the substrate is increased (raised higher) in comparison with melting starting temperature of the first metal film and the second metal film in the vicinity (neighborhood) of the interface when the electronic component is connected to the substrate. At least one of the first metal film and the second metal film includes at least one metal layer formed by plating.

Instead of the at least one metal layer formed by plating, at least one metal layer formed in thickness of 10 micrometers or more may be included in at least one of the first metal film and the second metal film. Moreover, thickness of the connecting portion formed between the electronic component and the substrate by the first metal film and the second metal film may be 20 micrometers or more.

The electronic component and the substrate are exemplified as an example of a pair of members to be connected. The first metal film and the second metal film are not limited to be formed by a single metal layer, and one or both of which may be formed by stacking a plurality of metal layers formed from different materials.

As an example of structural features of the electronic device, stable intermetallic compounds that exist near the interface at which the first metal film is contacted to the second metal film.

When a Si power device, in which a third electrode is formed on another main surface at a side opposite to a main surface on which the first electrode was formed, is used as the electronic component, and a fourth electrode to be electrically connected to the third electrode by a metal lead is formed on a main surface of the substrate on which the second electrode was formed, the first metal film is formed on the lead, and the second metal film is formed on the third electrode respectively. Then, regarding the lead and the third electrode, the uppermost surface of the first metal film and the uppermost surface of the second metal film formed respectively thereon are contacted to each other, and then the neighborhood of the interface at which the uppermost surfaces of the first metal film and the second metal film are contacted to each other is melted at the melting temperature or less and at the eutectic temperature or more of the first metal film and the second metal film, so that an alloy portion containing respective componential elements of the first metal film and the second metal film is formed in the neighborhood of the interface by diffusion reaction between the first metal film and the second metal film, thereby the lead and the third electrode are connected to each other, and melting starting temperature of the alloy portion after the lead and the third electrode have been connected to each other is made high compared with the melting starting temperature of the first metal film and the second metal film in the neighborhood of the interface when the lead is connected to the third electrode.

An example of the electronic device according to an embodiment of the invention is described as follows in an electronic device, wherein a first member and a second member having thermal expansion coefficients different from each other are joined by a joint layer interposed between respective main surfaces, and the joint layer is formed of at least a first metal and a second metal different from the first metal, for example. Firstly, concentration of the first metal in the joint layer is decreased at a side of the second member with respect to the center in a thickness direction of the joint layer (direction from a main surface of the first member to a main surface of the second member). Secondly, a region at a side of the first member in the thickness direction of the joint layer includes two types of eutectic structures (crystal grains) different in a concentration ratio between the first metal and the second metal, and a structure (crystal grains) of the second metal remains in another region near the second member with respect to the center in the thickness direction.

Thirdly, the joint layer includes structures of a plurality of solid solutions containing at least the first metal and the second metal, and two types of eutectic structure having concentration ratios between the first metal and the second metal being different from each other, and the eutectic structures exist among (in gaps among) the plurality of structures (crystal grains) of solid solution discretely by plurality thereof for each.

Another example of the electronic device of an embodiment of the invention includes a substrate, a Si power device mounted on one main surface of the substrate, and a metal sheet connected to the other main surface of the substrate, wherein a first electrode formed on a surface at a side opposite to the one main surface of the substrate of the Si power device is electrically connected to a second electrode formed on the one main surface of the substrate with a conductive metal material. A metal block is inserted between the conductive metal material and the second electrode so that the conductive metal material is not subjected to bending in a thickness direction of the substrate.

According to the embodiment of the invention, an electronic device having sufficient reliability can be provided, in addition, manufacturing cost can be reduced.

BRIEF DESCRIPTION OF THE DRAWINGS

FIG. 12(a) shows a section profile of a device immediately before a Si chip (first member) is connected to a substrate (second member), FIG. 12(b) shows a cross section of a joint layer (connection layer) formed by diffusion reaction between a layer of metal A formed on an electrode (connecting portion) of the Si chip and a layer of meal B formed on a wiring layer (connecting portion), FIG. 12(c) shows a distribution curve (solid line) of concentration of the metal B in the joint layer and an assumption curve (broken line) of the distribution, FIG. 12(d) shows an example of distribution of crystal grains in the joint layer, and FIG. 12(e) shows another example of the distribution of crystal grains in the joint layer, respectively.

DETAILED DESCRIPTION

Hereinafter, embodiments of the invention will be described.

Embodiment 1

An electronic device according to the invention is described below using an embodiment suitable for realizing an electric control unit for motor control (hereinafter, abbreviated as ECU) having sufficient reliability.

Figure 4:
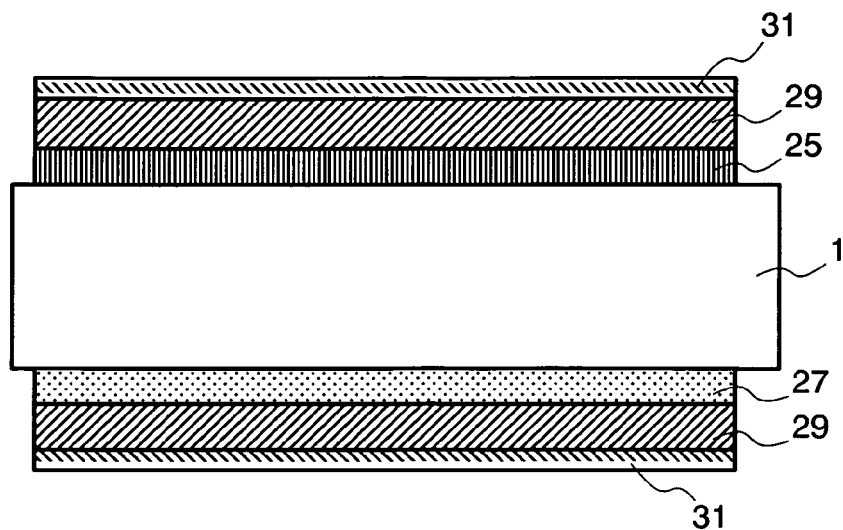
FIG. 4 is a cross section view showing a chip mounted on an electronic device according to an embodiment of the invention and an electrode structure of the chip.

First, FIG. 4 shows a schematic view of an electronic component including MOS-FET (Meal-Oxide Semiconductor Field Effect Transistor) formed on a Si base member of 5 mm on four sides and 0.3 mm in thickness (hereinafter, mentioned as MOS-FET chip or Si chip). In the MOS-FET chip, since a channel for flowing carriers (electrons and holes) in a thickness direction of a Si base member 1 is formed, two electrodes (source electrode and drain electrode) sandwiching the channel are formed on two main surfaces (top and bottom in FIG. 4) of the Si base member 1 respectively. A gate electrode for controlling flow of carriers in the channel is omitted in FIG. 4. The MOS-FET chip having such a structure is used as a power device for switching large current, for example, in power modules.

Ni (nickel) plating film 29 with thickness of 3 micrometers (μm) and Au plating film 31 with thickness of 0.05 micrometers are formed on an aluminum electrode 25 formed on one main surface (an upper surface) of the Si base member 1 as the source electrode of the MOS-FET chip, respectively. Similarly, Ni plating film 29 with thickness of 3 micrometers and Au plating film 31 with thickness of 0.05 micrometers are formed on an Ag electrode 27 formed as the drain electrode on a rear side of the Si chip (the other main surface of the Si base member 1, or a side opposite to the one main surface), respectively. Here, the Ni and Au plating films are formed by electroless plating. When the Ni plating film is formed thick, reliability of a connecting portion is improved, and to the end of achieving this, if electroplating is carried out, the rate of plating is increased, consequently manufacturing cost of the Si chip can be reduced.

Figure 5:
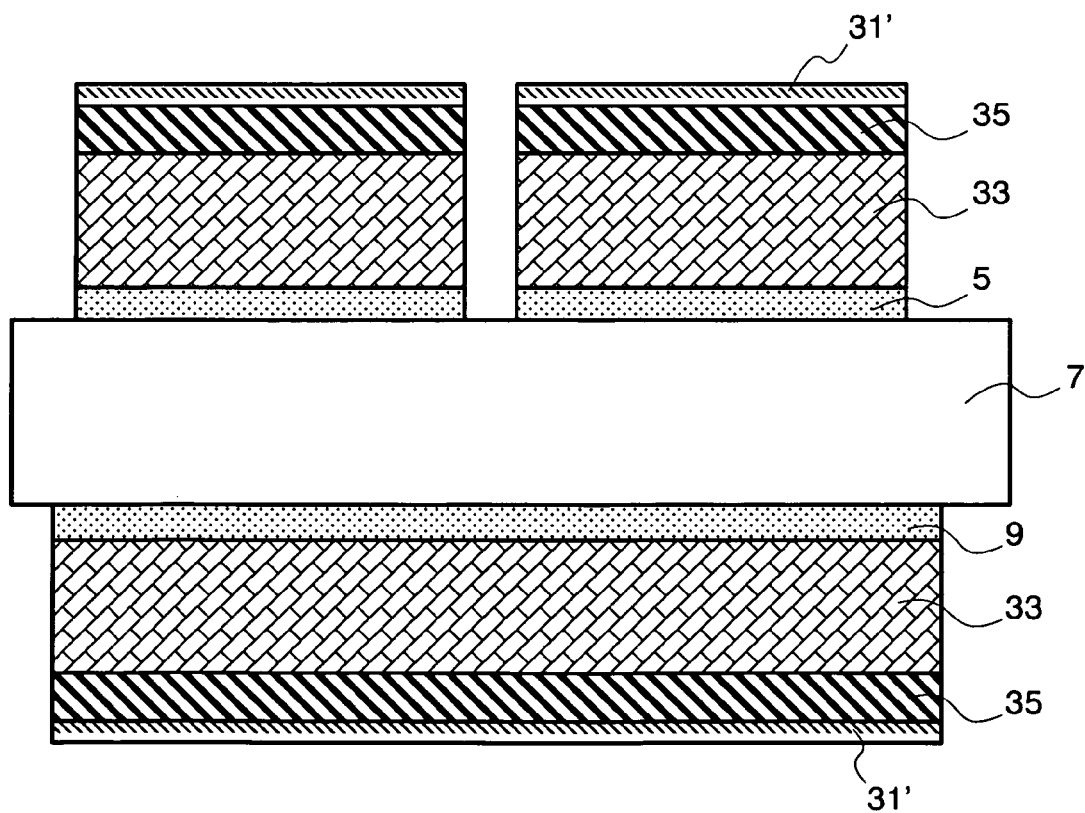
FIG. 5 is a cross section view showing part of a substrate used for the electronic device according to an embodiment of the invention and an electrode structure of the substrate.

Next, FIG. 5 shows a schematic view of a substrate on which the MOS-FET chip is mounted. The substrate uses a ceramic sheet 7 with thickness of 0.3 mm including $Si_3N_4$ (silicon nitride) having high heat conductivity as an insulating layer, and on one main surface of the ceramic sheet (hereinafter, sometimes mentioned as merely "substrate") 7, patterns of Cu 5 with thickness of 0.5 mm are formed as wiring lines and electrode layers. On a rear side of the ceramic sheet 7 (the other main surface of the ceramic sheet 7, or a side opposite to the one main surface), a Cu solid pattern 9, of which the thickness is set in consideration of wiring density and the patterns of Cu 5 in order to prevent a warp of the ceramic sheet (substrate) 7 due to the patterns of Cu 5 having larger thickness than that of the ceramic sheet 7, is formed, for example, 0.4 mm in thickness. A Sn film 33 with thickness of 30 micrometers is further formed by plating on each of electrodes for chip mounting (the patterns of Cu 5) and rear-side Cu solid pattern. An In film 35 one micrometer in thickness is formed by sputter on the Sn film 33, and an Au film 31' with thickness of 0.05 micrometers is further formed on the In film 35 by sputter for inhibiting surface oxidation of the In-film. In the MOS-FET chip 1 shown in FIG. 4, the drain electrode 27 formed on the other main surface is connected to one of the patterns of Cu 5 formed on the one main surface of the substrate (ceramic sheet) 7.

Figure 6:
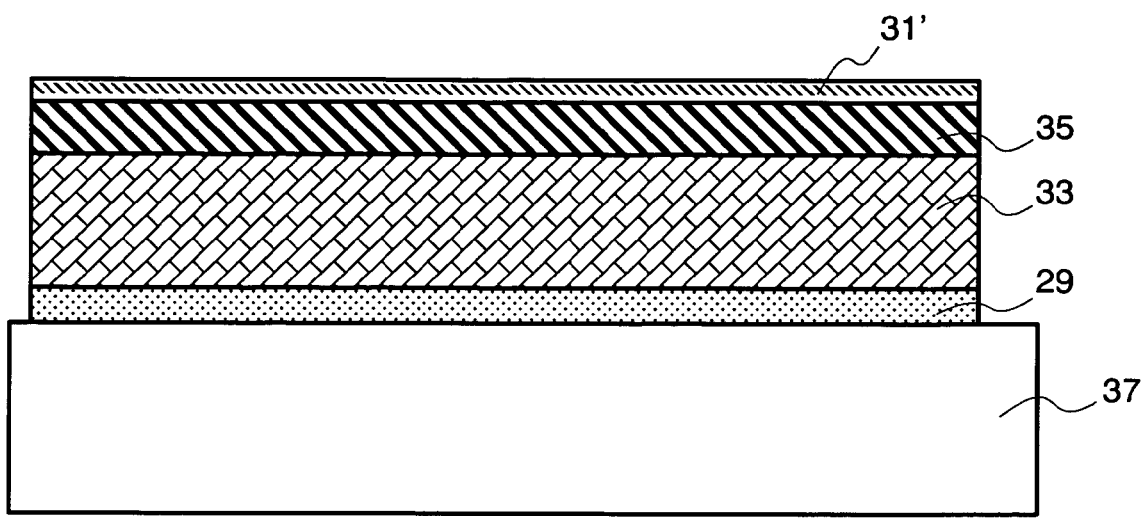
FIG. 6 is a cross section view among part of base metal used for the electronic device according to an embodiment of the invention and an electrode structure of the base metal.

Next, FIG. 6 shows a schematic view of a metal sheet (hereinafter, mentioned as base metal) that is connected to the other main surface (Cu solid pattern 9) of the substrate 7, in addition, acts as a heat sink. On a mounting position of the substrate 7 in a Cu base 37 with thickness of 2 mm that serves heat radiation of the MOS-FET chip 1 and reinforcement of the substrate 7, a Sn film 33 with thickness of 30 micrometers is formed by plating. An In film 35 one micrometer in thickness is formed by sputter on the Sn film 33, and an Au film 31' with thickness of 0.05 micrometers is further formed on the In film 35 by sputter for inhibiting surface oxidation of the In-film. A Ni plating film 29 between the Cu base 37 and the Sn film 33 shown in FIG. 6 may not be formed in some cases.

As a lead material that is a member for connecting between the source electrode 25 (29, 31) of the Si chip 1 and the electrode 5 (33, 35 and 31'), a Cu—Mo alloy (for example, Cu: 40% and Mo (molybdenum): 60%) is used. Thickness of the lead material is set to be 0.4 mm, and a Sn film 30 micrometers in thickness is formed by plating selectively on the lead material in correspondence with patterns of a spacer component described later and chip electrodes. An In film is formed one micrometer in thickness by sputter thereon, and an Au film 0.05 micrometers in thickness is further formed on the In film by sputter for inhibiting surface oxidation of the In-film.

Figure 1:
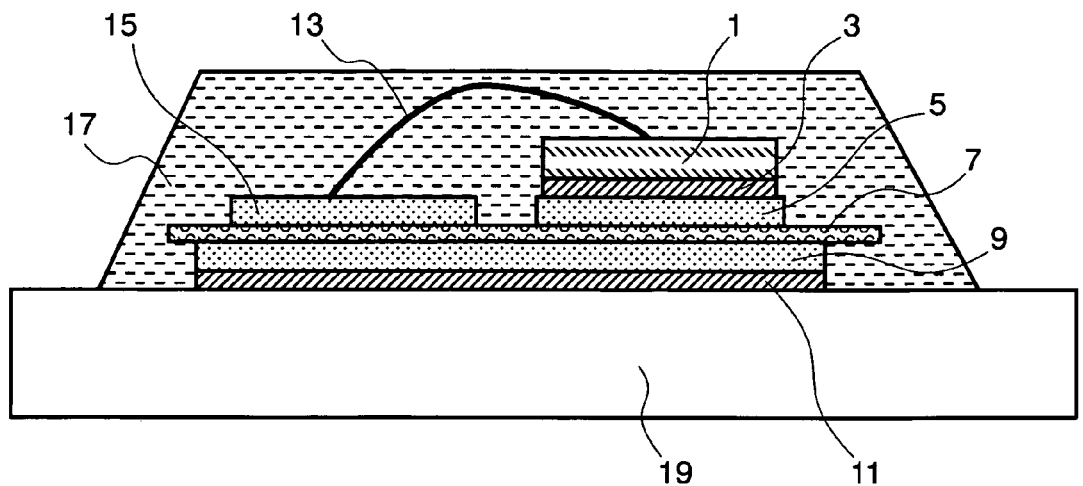
FIG. 1 is a cross section view of ECU for motor control of a wire bonding type in the related art.
Figure 2:
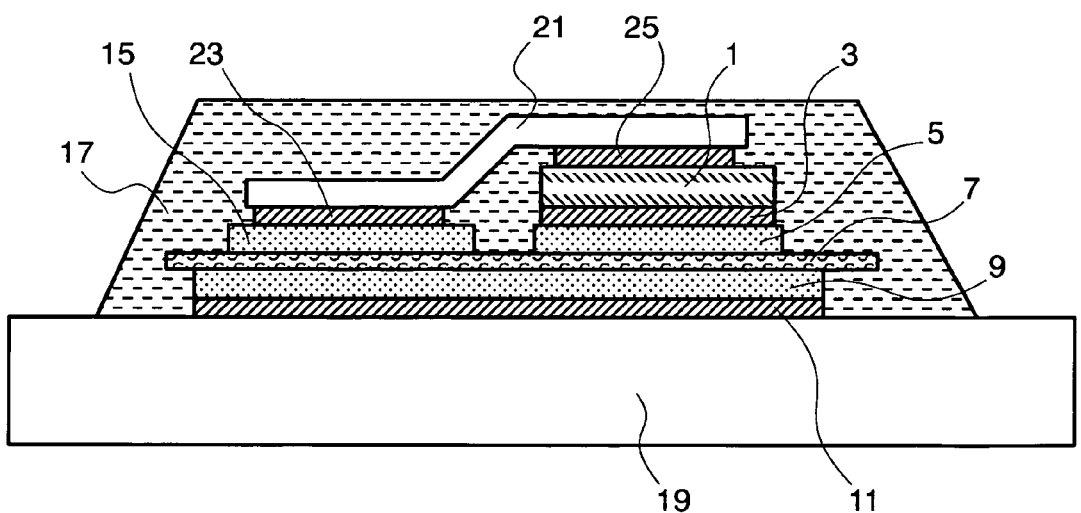
FIG. 2 is a cross section view of ECU for motor control of a lead connection type in the related art.
Figure 3:
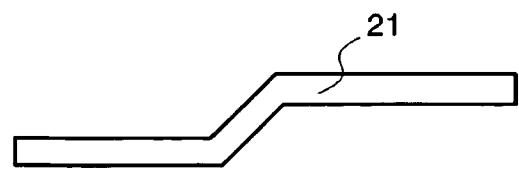
FIG. 3 is a view showing an example of a structure of a typical lead material in the related art.

The spacer component has approximately the same thickness as the Si chip 1, and by using the component, electrical connection between the source electrode 25 and the electrode 5 on the substrate can be made without needing bending of the lead material. If the spacer component is not used, since difference in height between a pad on the Si chip 1 (members 25, 29 and 31 exemplified as the source electrode) and a pad on the substrate (members 5, 33, 35 and 31' exemplified as the electrode) occurs by a level approximately corresponding to the thickness of the chip 1, when connection is made by solder between the lead and the pad on the chip, and between the lead and the pad on the substrate (including a case of general solder connection other than the embodiment), as shown in FIG. 3, the lead needs to be subjected to bending sufficient to absorb the height difference. The inventors found that failure due to cracking was likely to occur in a lead actually subjected to bending. Since the failure leads to increase in cost due to reduction in yield, use of a combination of the spacer component and a lead material without bending contributes to improve reliability of the electronic device.

Figure 7:
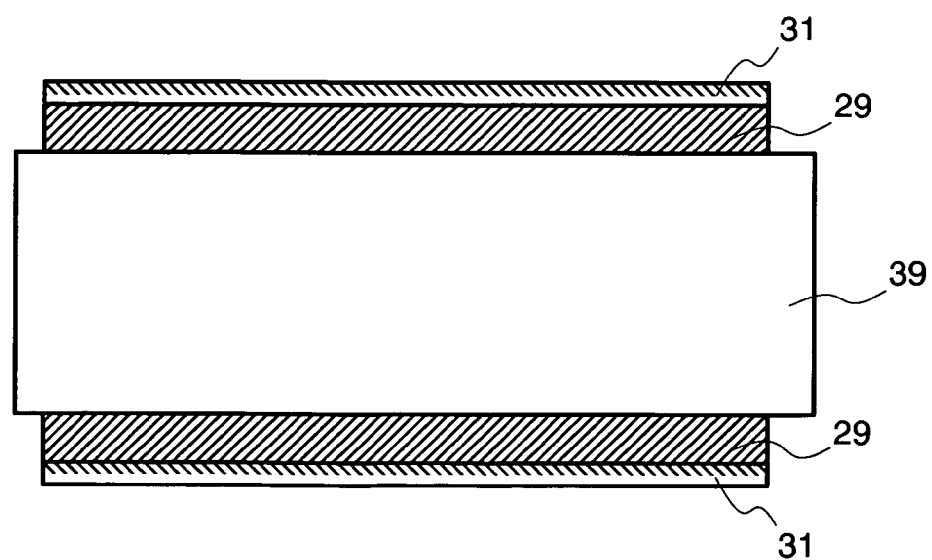
FIG. 7 is a cross section view showing a spacer component used for the electronic device according to an embodiment of the invention and an electrode structure of the component.

FIG. 7 shows a schematic view of the spacer component. The spacer component has a base member (block) 39 with thickness of 0.3 mm including the Cu—Mo alloy (for example, Cu: 40% and Mo (molybdenum): 60%) like the lead material. A Ni plating film 29 3 micrometers in thickness and an Au plating film 31 0.05 micrometers in thickness are formed on both sides of the base member 39, that is, a connecting portion surface to the lead and a connecting portion surface to the substrate in the spacer component, respectively.

Figure 8A:
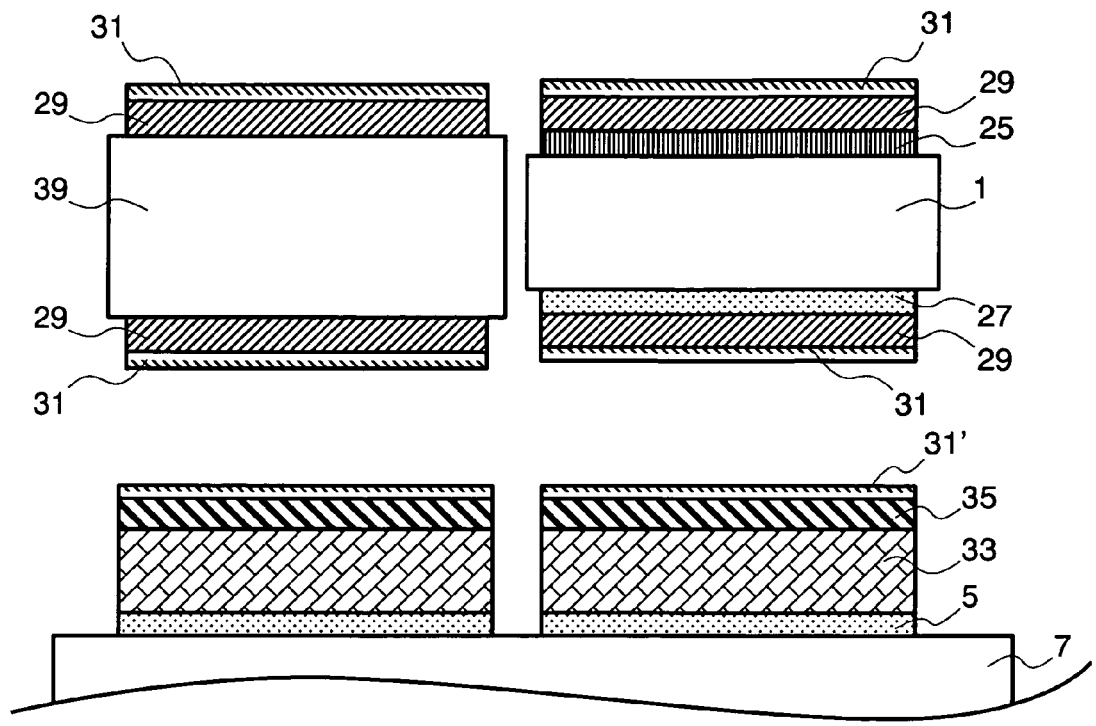
FIG. 8(a) and FIG. 8(b) are outline drawings showing a process of connecting the chip and the spacer component onto the substrate in a manufacturing method of the electronic device according to an embodiment of the invention, respectively.
Figure 8B:
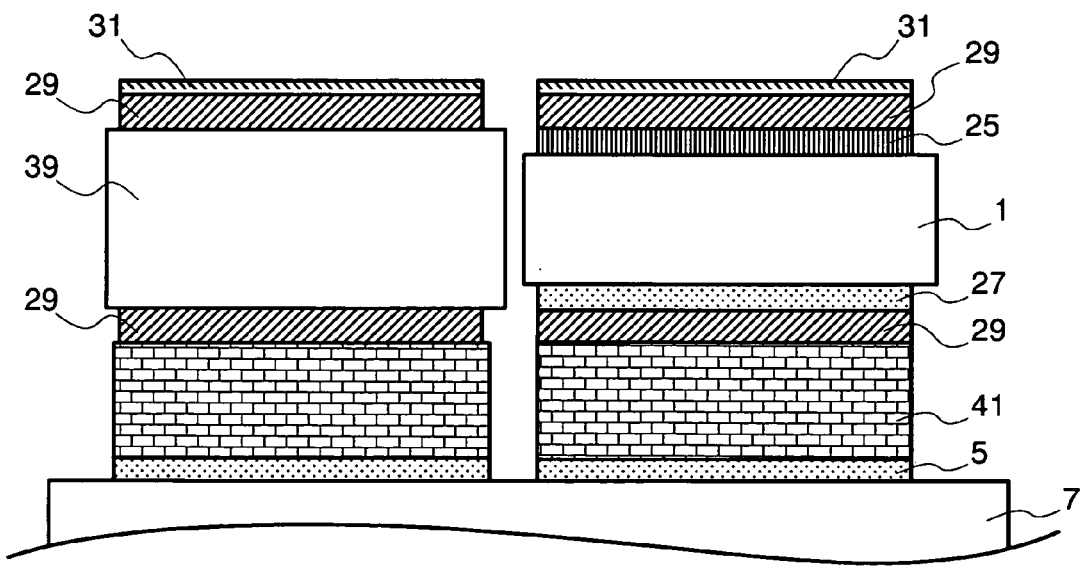

The Si chip 1, substrate 7, metal sheet 37 and spacer component 39, which have metal layers formed by plating or sputter on the electrodes and the electrode-like metal members 25, 27, 5, 9, 29 and 39 as described above, are connected to one another as described below, respectively. First, on the substrate 7, the Si chip 1 and the spacer component 39 were mounted on the predetermined pads (5, 33, 35 and 31') provided on the one main surface of the substrate 7, and then heated at 150° C. for 30 minutes in a hydrogen reduction atmosphere. The step is briefly shown in FIG. 8(a) and FIG. 8(b). When the drain electrode 27 of the Si chip 1 and the spacer component (base member) 39 are connected to the electrodes 5 on the substrate 7 respectively, stacked structures including part of the Ni plating film 29, the Au layers 31, 31', the In film 35, and the Sn plating layer 33, which are interposed between the drain electrode 27 as well as the spacer component (base member) 39 and the electrode 5 of the substrate 7, are changed into metal layers 41 containing a Sn—In alloy as a main component, and containing Ni, a Sn—Ni compound, an Au—Sn compound, and an Au—In compound.

Figure 9A:
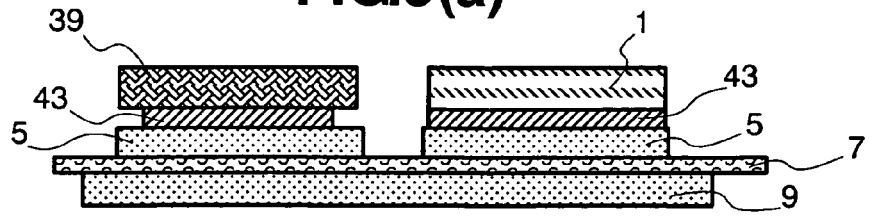
FIG. 9(a) to FIG. 9(d) are outline drawings showing a manufacturing process of ECU for motor control as an example of the electronic device according to an embodiment of the invention, respectively.

Since the metal layer 41 macroscopically has a composition rich in Sn, melting temperature of the layer is increased compared with temperature at which the stacked structure melts (about 150° C.) when the Si chip 1 and the spacer component 39 are connected to the substrate 7 (in initial connection). FIG. 9(a) shows a structure after the Si chip 1 and the spacer component 39 have been connected to the substrate 7, and the metal layer 41 with the Ni plating film 29 is shown as a connecting portion 43 (the drain electrode 27 was omitted because of small thickness). It was confirmed that breakdown due to cracking and the like did not occur in the Si chip 1 in a structure where the Si chip 1 and the spacer component 39 were connected to the substrate 7 in this way.

Figure 9B:
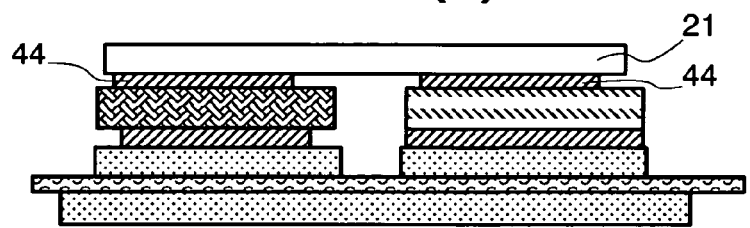

Next, as shown in FIG. 9(b), a lead 21 (for example, provided in a form of metal foil or metal sheet) was disposed in a way of extending from the pad (25, 29, 31) on the Si chip 1 to the pad (29, 31) of the spacer component 39, and then heated at the same condition as in the connection step (150° C. for 30 min in the hydrogen reduction atmosphere). At that time, since the connecting portions 41 between the substrate 7 and the Si chip 7 as well as the spacer component 39 have increased melting temperatures as described above, they are not melted. FIG. 9(b) shows a structure after the lead 21 has been connected to the Si chip 1 and the spacer component 39, and respective connecting portions 44 are formed by mutual diffusion by melting of the Ni plating film 29 and the Au plating film 31 each formed on the Si chip 1 and the spacer component 39, and the Sn plating film, In film (thickness of 1 micrometer), and Au plating film (thickness of 0.05 micrometers) each formed on the lead 21 (thickness of 30 micrometers). The source electrode 25 was omitted because of small thickness.

Figure 9C:
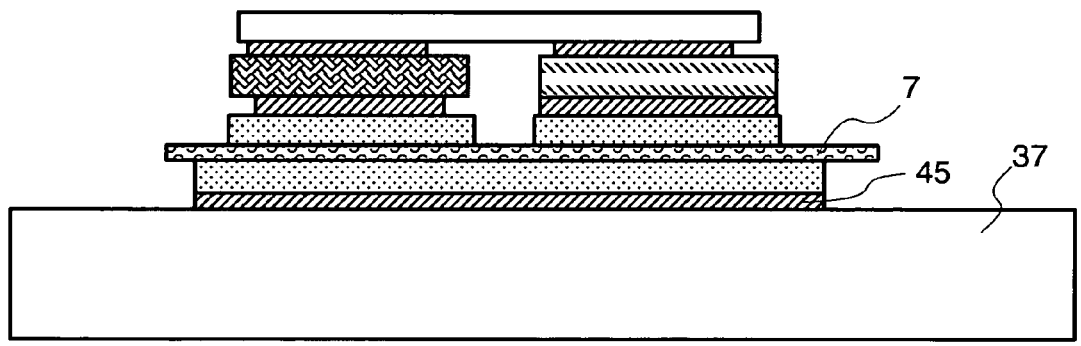

Furthermore, the substrate 7 connected with the Si chip 1, spacer component 39 and lead 21 as shown in FIG. 9(b) is mounted on a predetermined position (29, 33, 35 and 31') on the metal sheet (Cu base) 37 as shown in FIG. 9(c), and then similarly heated at 150° C. for 30 min. Again in this heating step, the previously formed connecting portions 43, 44 are not melted. Between the metal layer (Cu solid pattern 9, which may be patterned into wiring lines) formed on the other main surface of the substrate 7 and the metal sheet 37, a connecting portion 45 is formed due to counter diffusion by melting of the Sn plating layer 33, In film 35 and Au layer 31' formed on the metal layer 9, and the Ni plating film 29, Sn plating film 33, In film 35 and Au film 31' formed on the metal sheet 37.

Figure 9D:
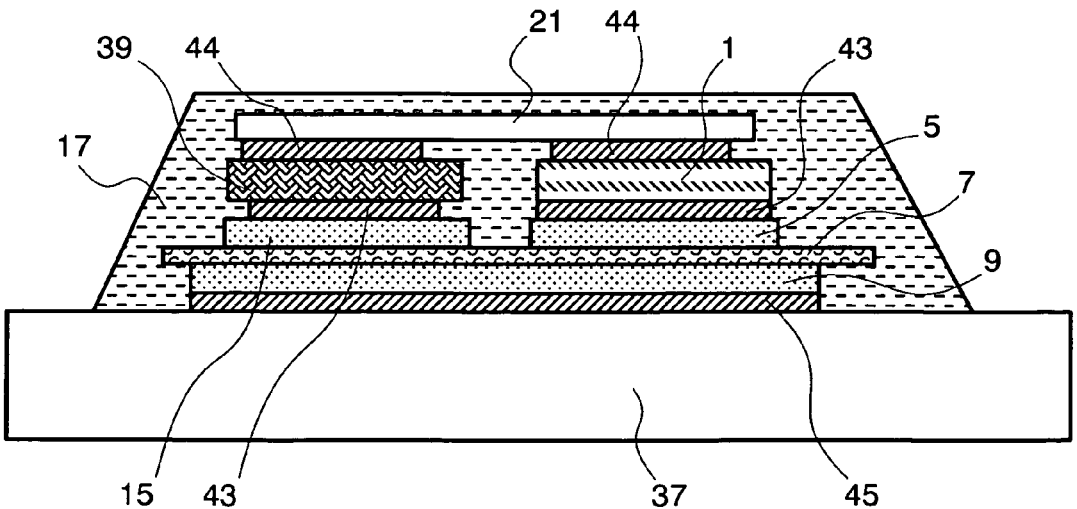
Figure 10:
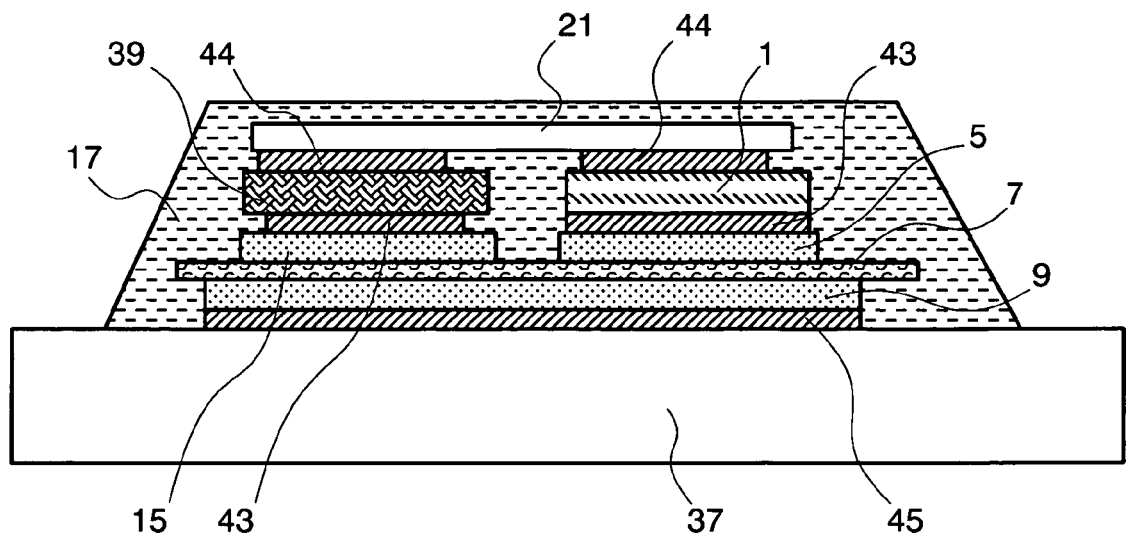
FIG. 10 is a cross section view of the ECU for motor control according to an embodiment of the invention.

Finally, all of the substrate 7, Si chip 1, spacer component 39 and lead 21 fixed to the metal sheet 37 are molded with resin 17 as shown in FIG. 9(d). An outline of the series of manufacturing process is shown in FIG. 9(a) to FIG. 9(d), and a final structure obtained as a result of the process is shown in FIG. 10. However, detailed representation of the metal layer associated with the connection is omitted in FIG. 10.

A module completed in this way (refer to FIG. 10) was subjected to a temperature cycling test that gave temperature change of −55 to 150° C. for each cycle in repetition of 1000 cycles. As a result, it was confirmed that breakdown or failure did not occur in the connecting portions 43, 44 and 45, and the module had sufficient reliability. From a result of simulation that was carried out separately, it was found that for the connecting portion between the chip 1 and the substrate 7, when size of the chip 1 was 1 mm or more, compared with a module having a connecting portion 43 5 micrometers in thickness, a module having the thickness of 10 micrometers was improved in reliability two times or more, and a module having the thickness of 30 micrometers was improved in reliability five times or more. Similarly, for the other connecting portions 44, 45, reliability of the module was improved two times or more by increasing the thickness of the connecting portion to 10 micrometers or more, consequently it was clarified that the module was highly likely to have sufficient reliability as the in-vehicle electronic device.

Embodiment 2

Figure 11:
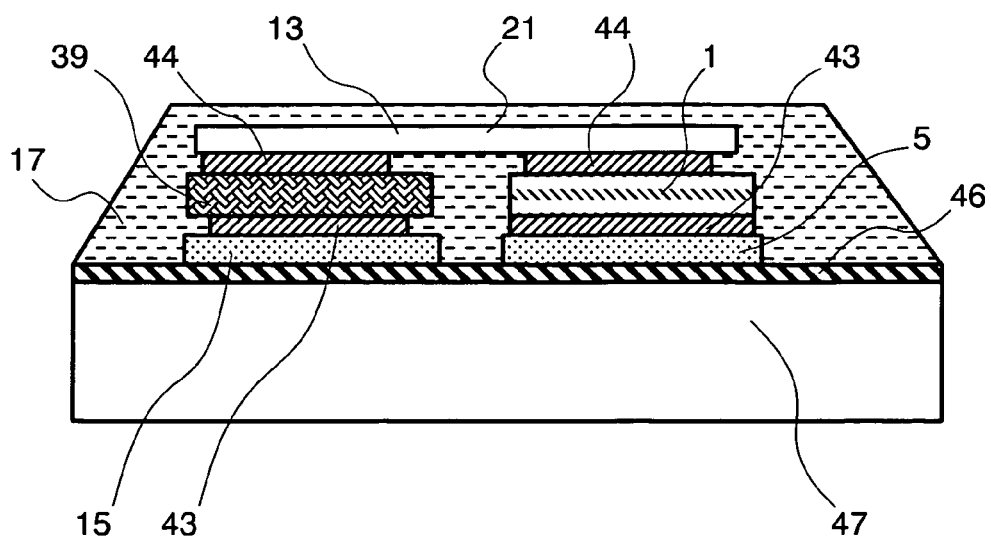
FIG. 11 is a cross section view of ECU for motor control described in embodiment 2 of the invention.

Another embodiment of an electronic device according to the invention is described below using FIG. 11. The electronic device (module) of the embodiment is different from that of the embodiment 1 in that a substrate in which one main surface of the metal base (for example, Cu base) 47 is insulated with resin 46 (called Cu base substrate for convenience) is used in place of the substrate 7 including an insulating material. In the Cu base substrate, a material having a heat conductivity of 2 W/m·K or more is used based on a demand of improving heat radiation performance in a total structure of the electronic device. Since the electronic device has the base metal 37 in the embodiment 1 within the substrate, a base substrate for heat radiation and reinforcement need not be separately provided in addition to the substrate. Therefore, the number of hierarchies of the connecting portions can be decreased one, consequently reduction in cost can be expected due to decrease in number of steps.

Moreover, the described Cu base substrate is replaced by a substrate having Al metal base, thereby while heat radiation performance is somewhat reduced compared with the Cu base substrate, decrease in weight of the electronic device as a whole can be achieved.

Embodiment 3

Here, regarding the described embodiment 1 and embodiment 2, features of connecting portions in the electronic device according to an embodiment of the invention are considered with reference to FIG. 12(a) to FIG. 12(e).

Figure 12A:
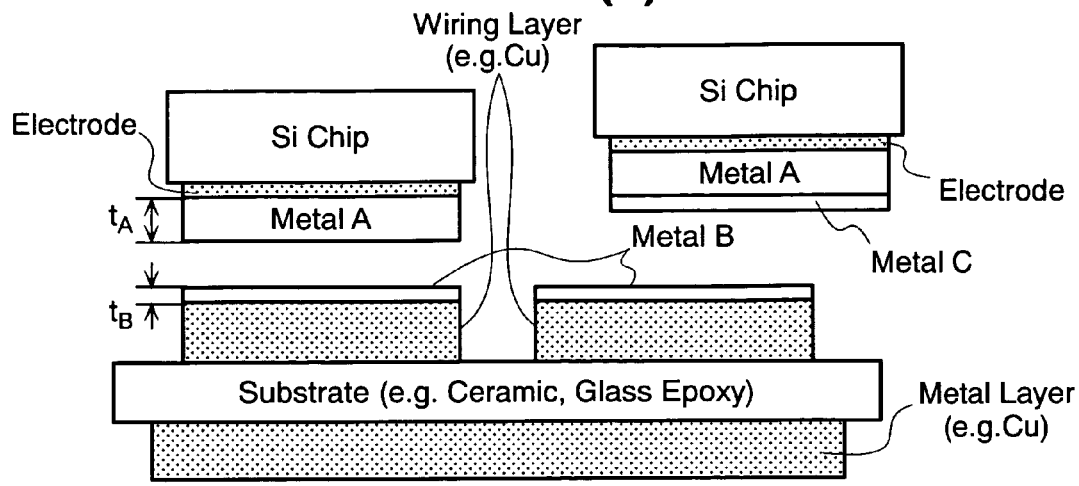
FIG. 12(a) to FIG. 12(e) are illustrative views to be referred for description of features of the electronic device (connecting portion) according to the invention in embodiment 3 of the invention.
Figure 12B:
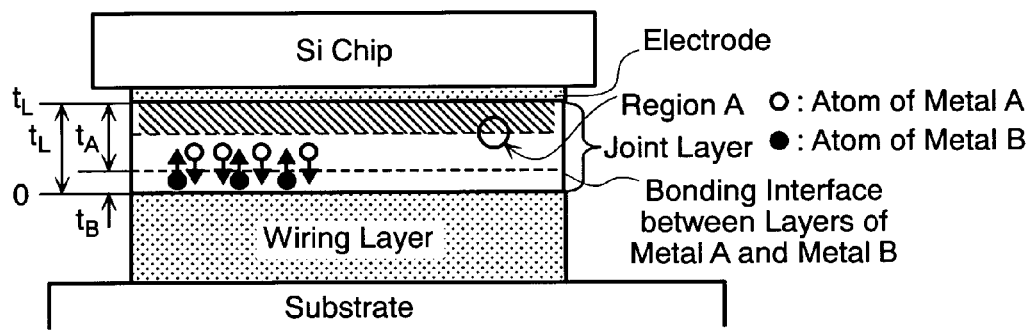

When two members to be joined have different thermal expansion coefficients from each other, certain thickness of a connecting portion (hereinafter, described as joint layer) formed between them contributes to restrain an effect of thermal expansion (deformation) of one of the two members on the other. In the case of a Si chip and a substrate exemplified in FIG. 12(a), a thermal expansion coefficient of the former is dominated by that of silicon, and a thermal expansion coefficient of the latter is dominated by that of, for example, a ceramic material, glass epoxy material, or metal sheet as a main component of the substrate. Therefore, sometimes the joint layer is industrially requested to be formed in a thickness of at least 10 μm, and desirably 20 to 100 μm. The thickness $t_L$ varies depending on the amount of the current controlled by the electronic device or use environment of the device, and reflects deformation due to temperature change of members in the power module which is not seen in light electrical appliances. Therefore, at least one of a metal film A and a metal film B having a composition different from that of the metal A, which are formed on two members as shown in FIG. 12(a) respectively and form a joint layer between them as shown in FIG. 12(b), is desirably formed by plating. Alternatively, both of films of the metal A and the metal B may be formed by plating as necessary. The sputter method described in the non-patent literature 1 can not form industrially the at least one of the films of metal A and metal B in sufficient thickness, consequently thickness of the joint layer that meets the request can not be secured.

On the other hand, in a phenomenon of formation of the joint layer, an embodiment of the invention does not necessarily require that a composition of the joint layer is made uniform by solid-liquid phase diffusion of two kinds of metals as taught in the non-patent literature 1. For example, even if the composition of the joint layer is changed in a thickness direction of the layer (in other words, from one of the two members to be joined to the other), the described effects are obtained. When it is assumed that the metal A is Sn and the metal B is In, and a joint layer exhibiting the melting temperature at a composition of Sn(85% )-In(15% ) is formed, since diffusion of the metal A and metal B proceeds sufficiently in the method of the non-patent literature 1, a structure (crystal grains, stable intermetallic compounds) of γ solid solution of Sn—In is formed in a whole region of the joint layer, consequently the joint layer shows the composition or a similar composition thereto uniformly.

Figure 12C:
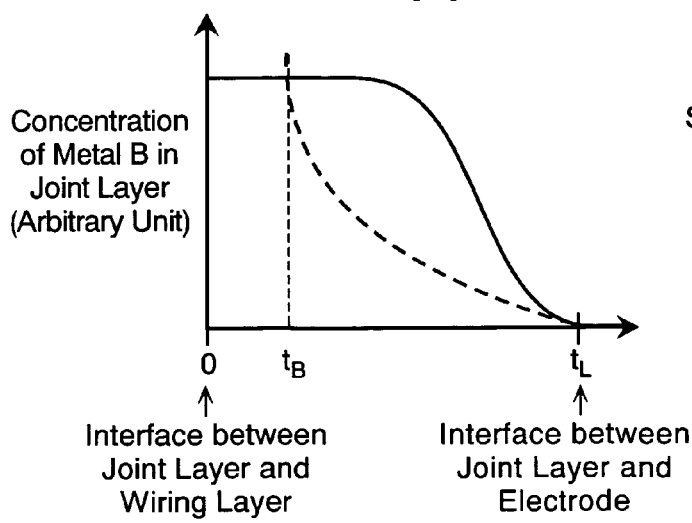

On the other hand, in the macroscopic view of an embodiment of the invention, melting of the metal film A and metal film B occurs only at an interface where they are contacted and in the vicinity (neighborhood) of the interface. This can be considered to be a reason for the fact that heating temperature in connecting the metal A to metal B can be lowered compared with melting temperature of the joint layer obtained as a result of the connection. In an example of concentration distribution of the metal B in the joint layer as shown in FIG. 12(c), a value of the concentration is constant at a side of the metal film B before joining (side of an interface between the joint layer and the wiring layer on the substrate), however, at a side of the metal film A before joining (side of an interface between the joint layer and the electrode on the Si chip), while it is kept constant near the contact interface between the metal film A and the metal film B, it steeply decreases in a region comparatively near the side of the interface between the joint layer and the electrode on the Si chip. Furthermore, a curve of such change of the concentration of the metal B at the metal A side is different from a curve of a broken line depicted on the assumption that the element of the metal B is diffused from the contact interface between the metal A and the metal B into the metal A according to the Fick's law.

Figure 12D:
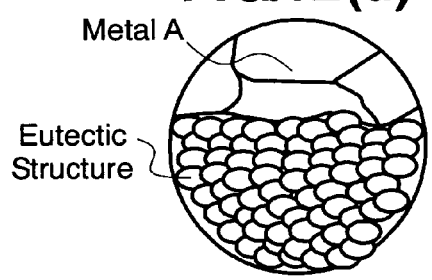
Figure 12E:
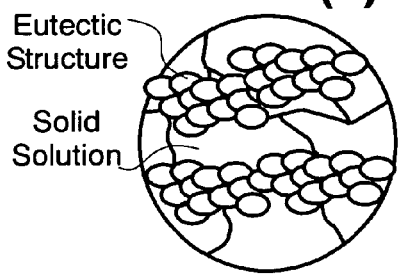

Moreover, for distribution of the crystal grains in the joint layer, two examples as shown in FIG. 12(d) and FIG. 12(e) can be considered. In the case of FIG. 12(d), a eutectic structure including crystal grains having high concentration of the metal A and crystal grains having high concentration of the metal B is formed in a region where counter diffusion between the metal A and the metal B occurs, and in a region near that region, the number of crystal grains of the former is different from the number of crystal grains of the latter in a unit area depending on the ratio of concentration between the metal A and the metal B. When it is assumed that the metal A is Sn and the metal B is In, the former is the γ solid solution and the latter is β solid solution. However, at the side of the interface of the joint layer to the Si chip, a region where the metal B is not sufficiently diffused is remained, consequently a structure of the metal itself is remained.

In the case of FIG. 12(e), while the solid solution having a composition depending on thickness $t_A$ of the metal A and thickness $t_B$ of the metal B (solid solution having high concentration of the metal A) forms primary crystal, the eutectic structure penetrates into spaces among structures of the crystal. Furthermore, when a so-called stable intermetallic compound may be formed from the metal A and the metal B, sometimes only the intermetallic compound formed from the metal A and the metal B exist in a region where the metal A and the metal B are sufficiently diffused into each other, and consequently the ratio of the composition between the metal A and the metal B becomes uniform in the region. On the other hand, in a region where the diffusion is insufficient, the ratio of the composition between the metal A and the metal B varies in accordance with the volume or number of solid solution portions, which are portions other than the eutectic structure and the intermetallic compounds.

Respective cases described with reference to FIG. 12(c) to FIG. 12(e) may occur not only in the joint layer formed using Sn as the metal A and In as the metal B respectively, but also in a joint layer formed using Sn as the metal A and Bi (bismuth) as the metal B respectively, a joint layer formed using Ag as the metal A and Sn as the metal B respectively, and a joint layer formed using Cu as the metal A and Sn as the metal B respectively.

Moreover, as shown in FIG. 12(a), it is also acceptable that a film of the metal A and a film of metal C different from the metal A are stacked on one of the two members to be connected (here, the Si chip), and respective elements are diffused between the metal A and the metal C before the one member is joined to the other member (here, the substrate). When the film of the metal C is formed thin compared with the film of the metal A, an uppermost surface of the film of the metal C is formed from a metal structure including solid solution of the metal A and the metal C. Respective cases described with reference to FIG. 12(c) to FIG. 12(e) may also occur in the case that respective elements contained in the solid solution and the metal B formed on the other member are diffused between the solid solution and the metal B. In this case, since the composition of the solid solution of the metal A and the metal C can be different from the composition of the metal B, the metal C may be either the same material as the metal B, or a different material from the metal B. While the film of the metal A was formed thick by plating compared with the films of the metal B and the metal C in FIG. 12(a), it is also acceptable that the film of the metal B is formed thick by plating, and the films of the metal A and the metal C are formed thin by sputter compared with the film of the metal B.

It can be concluded from respective cases described with reference to FIG. 12(c) to FIG. 12(e) that such change along the thickness of the joint layer contributes to increase a value of melting temperature of the joint layer as a whole to a desired value, in addition, absorb stress or strain due to difference in thermal expansion coefficient between two members to be joined, the stress or strain being applied from one of the members to the other.

An embodiment of the invention can be also applied to electronic devices for vehicles, inverters for railway vehicles, industrial generators and the like.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. An electronic device comprising:
   a substrate;
   an Si power device mounted on one main surface of the substrate; and
   a metal sheet connected to the other main surface of the substrate;
   wherein a first electrode formed on a surface at a side opposite to the one main surface of the substrate of the Si power device is electrically connected to a second electrode formed on the one main surface of the substrate with a conductive metal material, and
   a metal block is inserted between the conductive metal material and the second electrode so that the conductive metal material is not subjected to bending in a thickness direction of the substrate,
   wherein at least one of: connection between the Si power device as well as the block and the substrate; connection between the Si cower device as well as the block and the conductive metal material; and connection between the substrate and the metal sheet is made in a way that:
   a first metal film is formed on one of two members to be connected, and the second metal film is formed on the other of them respectively, wherein the first and second metal films have different compositions from one another,
   an uppermost surface of the first metal film is contacted to an uppermost surface of the second metal film, and then the neighborhood of an interface at which the uppermost surfaces of the first metal film and the second metal film are contacted to each other is melted at melting temperature or less of each of the first metal film and the second metal film and at eutectic temperature or more of the first metal film and the second metal film, so that an alloy portion containing respective componential elements of the first metal film and the second metal film is formed in the neighborhood of the interface by diffusion reaction between the first metal film and the second metal film, and
   melting starting temperature of the alloy portion after the connection is increased compared with melting starting temperature of the first metal film and the second metal film in the neighborhood of the interface in the connection.

* * * * *